United States Patent
Kitahara et al.

[11] Patent Number: 5,482,068
[45] Date of Patent: Jan. 9, 1996

[54] CLEANING APPARATUS

[75] Inventors: Shigenori Kitahara, Kumamoto; Takashi Terada, Kurume, both of Japan

[73] Assignees: Tokyo Electron Limited, Tokyo; Tokyo Electron Kyushu Limited, Tosu, both of Japan

[21] Appl. No.: 292,284

[22] Filed: Aug. 18, 1994

[30] Foreign Application Priority Data

Aug. 18, 1993 [JP] Japan ................... 5-226496

[51] Int. Cl.[6] ................... B08B 3/04
[52] U.S. Cl. ................... 134/182; 134/902
[58] Field of Search ................... 134/902, 182

[56] References Cited

U.S. PATENT DOCUMENTS

| 5,000,795 | 3/1991 | Chung et al. | 134/902 X |
| 5,327,921 | 7/1994 | Mokuo et al. | 134/182 |

FOREIGN PATENT DOCUMENTS

| 56321 | 2/1992 | Japan | 134/902 |
| 166793 | 7/1993 | Japan | 134/902 |

Primary Examiner—Philip R. Coe
Attorney, Agent, or Firm—Oblon, Spivak, McClelland, Maier & Neustadt

[57] ABSTRACT

A chemical cleaning section of a semiconductor wafer cleaning system has a processing vessel. Two cleaning liquid supplying ports are formed in a bottom portion of the vessel. A holder for holding a plurality of wafers at intervals is arranged in the vessel. A rectifying plate is arranged between the holder and the supplying ports and a diffusion plate is arranged between the rectifying plate and the supplying ports. Bubble storage members are formed on a lower surface of the rectifying plate, so as to be located just above both side edges of the diffusion plate extending in a direction in which the wafers are aligned. The bubble storages are connected to the outside of the vessel through exhaust holes and exhaust pipes. Bubbles contained in a cleaning liquid supplied through the supplying ports are discharged from the bubble storages through the exhaust pipes to the outside of the vessel. As a result, the wafers are not influenced by the bubbles.

19 Claims, 7 Drawing Sheets

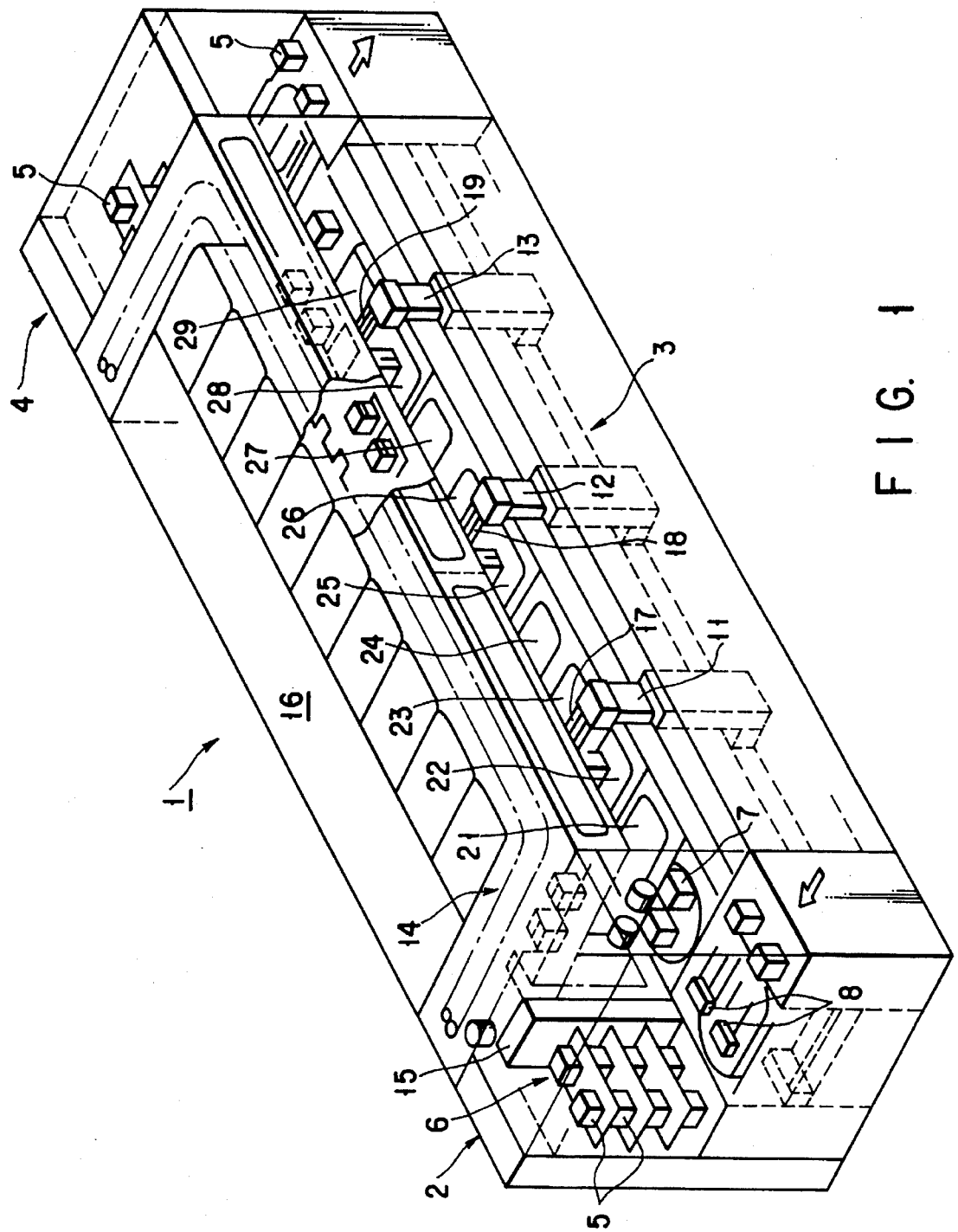
F I G. 1

CLEANING APPARATUS

BACKGROUND OF THE INVENTION

1. Field of the Invention

The present invention relates to a cleaning apparatus used as a processing section in a semiconductor processing system for processing substrates, such as semiconductor wafers and LCD substrates.

2. Description of the Related Art

In a manufacturing process for a semiconductor device such as an LSI, cleaning systems are used to remove contaminants such as particles, organic contaminants and metal impurities on a semiconductor wafer surface. Of these systems, a wet cleaning system is widely used because it can effectively remove particles and enables a batch process.

The wet cleaning system is constructed so as to clean substrates to be processed, such as wafers, with chemicals, e.g., ammonia, hydrofluoric acid, sulfuric acid, and hydrochloric acid, and also with pure water. Cleaning by means of chemicals and pure water is performed in a process vessel in a cleaning section, i.e., a processing section to which various cleaning liquids are supplied.

FIG. 12 shows a conventional process vessel. Cleaning liquid supplying ports 102 and 103 are formed in a bottom portion of a process vessel 101. Disk-like diffusion plates 104 are individually provided above the supplying ports 102 and 103. A rectifying plate 107 having a plurality of holes is arranged horizontally above the diffusion plates 104. A predetermined number of (e.g., 50) wafers w, i.e., substrates to be processed, are supported on a wafer holder 108 located above the rectifying plate 107.

A cleaning liquid supplied through the supplying ports 102 and 103 is diffused in radial directions of the diffusion plates 104, upon striking against the plates. The cleaning liquid is supplied to the process vessel 101 through the holes 106 of the rectifying plate 107. Any overflow of cleaning liquid flows to a receiver 109 provided in the front and rear sides of the cleaning vessel 101. The liquid received in the receiver 109 is circulated by a pump 111 and returned to the supplying ports 102 and 103 through a filter 110.

Bubbles are sometimes generated in a cleaning liquid. The bubbles become greater as they rise upward from the supplying ports 102 and 103, in accordance with the decrease in liquid pressure. If hydrofluoric acid is used as the cleaning liquid, bubbles are liable to be generated in particular and adhere to the surfaces of wafers, resulting in the wafers being cleaned nonuniformly. In addition, since the bubbles are a hotbed of dust particles, the surfaces of the wafers W tend to be contaminated. Since the wafers W are supported with only the edges engaged with grooves formed in the holder 108, they are vibrated by the bubbles. As a result, contaminants are generated from contact portions between the holder grooves and wafer edges.

To prevent contamination, according to the conventional art, bubbles are trapped by the filter 110 and returned to the receiver 109. However, since the cleaning liquid is supplied by the pump 111 with a pressure of about 2 kgf/cm$^2$, the bubbles become very small due to the pressure, while the liquid is being supplied. Therefore, the filter 110 cannot sufficiently trap the small bubbles in the cleaning liquid.

SUMMARY OF THE INVENTION

An object of the present invention is to provide a cleaning apparatus in which the flow of a cleaning liquid in a process vessel is optimized and substrates to be processed are uniformly cleaned.

Another object of the present invention is to provide a cleaning apparatus which prevents bubbles contained in a cleaning liquid from adversely affecting substrates to be processed, supported in a process vessel.

According to a first aspect of the present invention, there is provided a cleaning apparatus in a semiconductor processing system, comprising:

- a process vessel for storing a cleaning liquid;
- a supplying system for supplying the cleaning liquid, having a supplying port arranged in a lower portion of the process vessel;
- a holder for holding a plurality of substrates to be processed in the vessel, such that the substrates are arranged in a first direction at intervals, the holder being provided above the supplying port in the vessel;
- a rectifying plate, interposed between the supplying port and the holder, partitioning the process vessel into a cleaning area in which the holder is provided and a bottom area in which the supplying port is arranged, the rectifying plate having a slit which connects the bottom area and the cleaning area, the slit extending in the first direction and being located under the substrates to be process, which are arranged on the holder; and
- a diffusion plate interposed between the supplying port and the rectifying plate so as to cross a vertical line connecting the supplying port and the slit.

According to a second aspect of the present invention, there is provided a cleaning apparatus in a semiconductor processing system, comprising:

- a process vessel for storing a cleaning liquid;
- a supplying system for supplying the cleaning liquid, having a supplying port arranged in a lower portion of the process vessel;
- a holder for holding a plurality of substrates to be processed in the vessel, such that the substrates are arranged in a first direction at intervals, the holder being provided above the supplying port in the vessel;
- a rectifying plate, interposed between the supplying port and the holder, partitioning the process vessel into a cleaning area in which the holder is provided and a bottom area in which the supplying port is arranged, the rectifying plate having an opening which connects the bottom area and the cleaning area;
- a diffusion plate interposed between the supplying port and the rectifying plate so as to cross a vertical line connecting the supplying port and the opening;
- a bubble storage, arranged between the diffusion plate and the rectifying plate, for collecting bubbles contained in the cleaning liquid; and
- an exhaust passage connecting the bubble storage and an outside of the vessel.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view showing a semiconductor wafer cleaning system according to an embodiment of the present invention;

DESCRIPTION OF THE PREFERRED EMBODIMENTS

Figure 2:
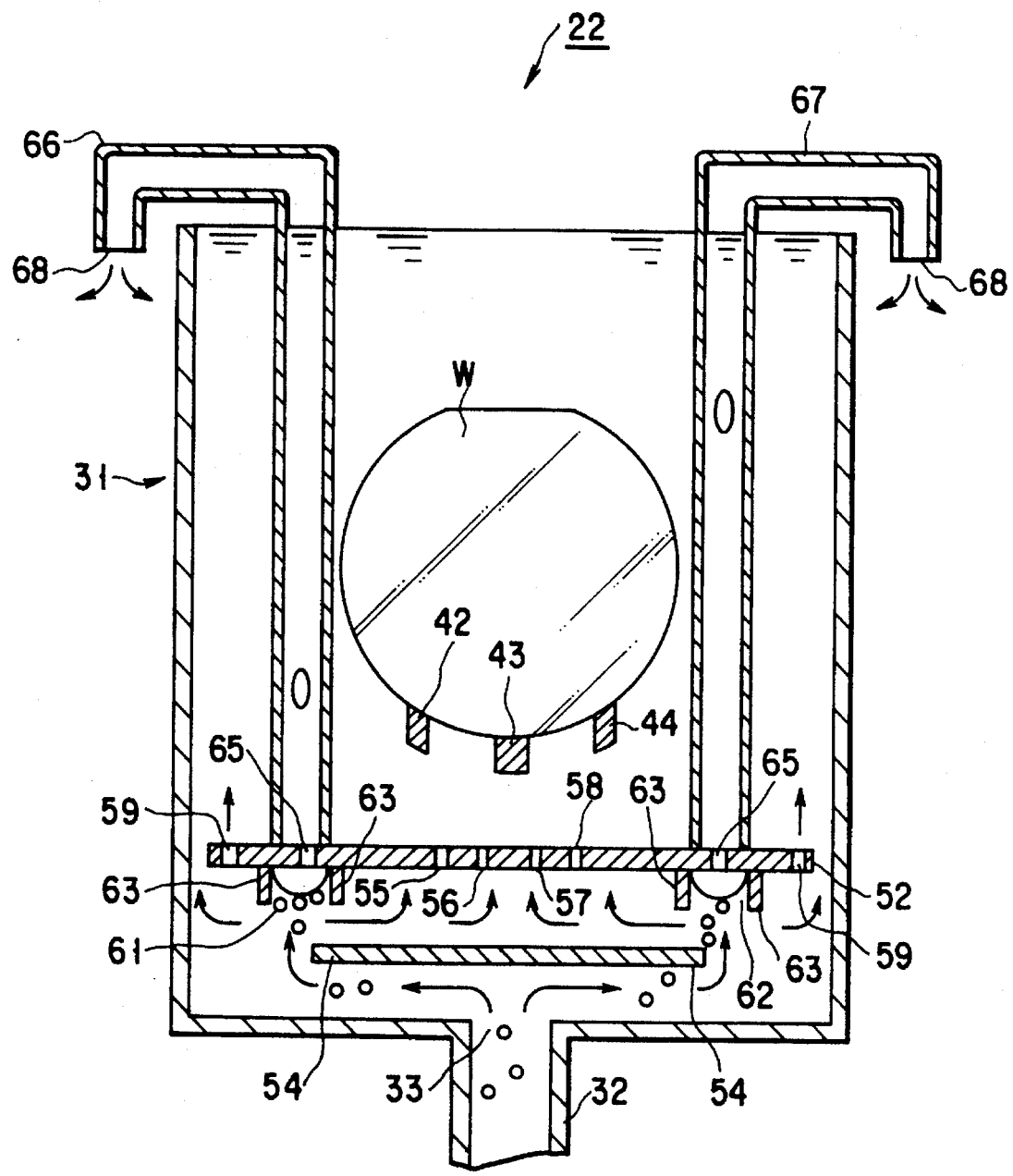
FIG. 2 is a cross-sectional front view showing the interior of a process vessel of a chemical cleaning section of the cleaning system shown in FIG. 1.

A cleaning apparatus according to the present invention is used as a processing section, i.e., cleaning section, for example, in a semiconductor wafer cleaning system shown in FIG. 1. As shown in FIG. 1, a cleaning system 1 is constituted by a total of three zones, i.e., an input unit 2, a cleaning unit 3 and an output unit 4.

A carrier convey device 8 is arranged in the input unit 2. The carrier device 8 conveys a wafer cassette 5 externally loaded by a convey robot or the like. A predetermined number of uncleaned wafers, e.g., 25 wafers, are stored in the wafer cassette 5. The wafer cassette 5 placed on the mount table of the input unit 2 is conveyed directly to the cleaning unit 3 or to a store section 6 by the carrier convey device 8, and is set in a standby state.

In the cleaning unit 3, a loader 7 is arranged to be adjacent to the input unit 2. For example, the loader 7 takes out wafer from the wafer cassette 5, performs orientation flat alignment and detects the number of wafers. The wafer cassette 5 is conveyed from the store section 6 to the loader 7 by the carrier convey device 8. An unloader is also arranged in the cleaning unit 3 to be adjacent to the output unit 4. For example, the unloader loads wafers into the wafer cassette 5, performs orientation flat alignment and detects the number of wafers. The wafer cassette 5 is conveyed from the unloader to the output unit 4 by a convey device arranged in the output unit 4.

In the cleaning unit 3, three wafer conveying robots 11, 12 and 13 are arranged on the front side (the front side in FIG. 1). A cassette cleaning line 14 is arranged above the cleaning unit 3 to extend therealong. The cassette cleaning line 14 cleans and dries each empty cassette 5 from which wafers are taken out by the conveying robot 11 on the upstream side. Cassettes are supplied to the cleaning line 14 by the loader 7 and a lifter 15.

A lifter (not shown) identical to the lifter 15 is also arranged on the output unit 4 side. An empty cassette 5 from the cleaning line 14 is set at a predetermined position on the unloader on the output unit 4 side by this lifter.

On the rear side of the cleaning unit 3, a back space 16 for arranging tanks containing processing liquids such as chemicals and various pipes, is formed behind a partitioning wall.

In the cleaning unit 3, a plurality of processing sections 21 to 29, each having a vessel made of, e.g., quartz, are arranged in a row. More specifically, the processing sections 21 to 29 are: a chuck cleaning section 21, a first chemical cleaning section 22, water cleaning sections 23 and 24, a second chemical cleaning section 25, water cleaning sections 26 and 27, a chuck cleaning section 28 and a drying section 29, which are arranged in this order from the loader 7 side.

The chuck cleaning section 21 cleans and dries a wafer chuck 17 of the conveying robot 11 on the upstream side. The first chemical cleaning section 22 cleans impurities such as organic contaminants, metal impurities and particles from a wafer surface by using a chemical solution. The water cleaning sections 23 and 24 clean the wafers, which have been cleaned by the first chemical cleaning section 22, by using, e.g., pure water. The second chemical cleaning section 25 cleans wafers by using a chemical solution different from that used in the first chemical cleaning section 22. The water cleaning sections 26 and 27 clean the wafers, which have been cleaned by the second chemical cleaning section 25, by using, e.g., pure water. The chuck cleaning section 28 cleans and dries a wafer chuck 19 of the conveying robot 13 on the downstream side. The drying section 29 dries wafers, from which impurities have been removed, by evaporation using, e.g., IPA (isopropyl alcohol). In the chemical cleaning sections 22 and 25, the respective chemical solutions overflow and circulate. Upon being circulated, impurities accumulated in the respective cleaning solutions are removed.

The wafer conveying robots 11, 12 and 13, having basically the same structure, respectively have wafer chucks 17, 18 and 19 for handling wafers. They are capable of moving in the arranging direction (X direction) of the respective cleaning sections. Each robot comprises a driving section for moving the wafer chuck in the vertical direction (Z direction) and the longitudinal direction (Y direction) of each cleaning section.

In the chemical cleaning sections 22 and 25 and the water cleaning sections 23, 24 and 26 and 27, the vessels for storing a chemical or water have similar structures. In the following discussion, the chemical cleaning section (e.g., hydrofluoric acid cleaning section) 22, which is to preferably be improved by the present invention, will be described with reference to FIGS. 2 to 4.

A wafer holder 41 is arranged across the front and rear walls in a rectangular processing vessel 31 of the chemical cleaning section 22. A rectifying member 51, constituted by a diffusion plate 54 and a rectifying plate 52, is arranged under the holder 41. Chemical supplying ports 33 are formed in two portions of the bottom of the processing vessel 31. A chemical liquid is supplied to the ports through a circulating pipe 32 by a pump (not shown).

The wafer holder 41 has three rods 42, 43 and 44 arranged parallel with each other in horizontal positions. Supporting grooves 45 (e.g., 50 grooves) for supporting the wafers W are formed at regular intervals on the surfaces of the rods 42, 43 and 44. The edges of the 50 wafers W held by the wafer chuck 17 are inserted in the grooves 45 of the rods 42, 43 and 44. As a result, 50 wafers are received by the wafer holder 41 at a time.

The rectifying member 51 has the rectifying plate 52, which is horizontally arranged under the wafer holder 41 so as to divide the process vessel 31 into upper and lower portions. It also has the diffusion plate under the rectifying plate 52 and parallel thereto. The rectifying plate 52 and the diffusion plate 54 are integrally connected with each other via a support column 53. These plates and column are formed of an anticorrosive material, such as quartz. The diffusion plate 54 is of the same length as the rectifying plate 52 but is narrower.

Four slits 55, 56, 57 and 58 are formed over substantially all the length of the rectifying plate 52. These slits have the same shape and size, and are symmetrically arranged with respect to the central axis of the wafers W. Each of the slits is 5 mm wide. The distance between the slits 55 and 56 and between the slits 57 and 58 is 35 mm, and the distance between the slits 56 and 57 is 30 mm (as measured from the center of the respective slits). It is preferable that the width of each slit be at least 3 mm and the distance between adjacent slits be at least 30 mm. A number of small holes 59 are formed near both side edges of the rectifying plate 52 at regular intervals of, for example, the same distance between the grooves 45 in the holder 41, such that one hole is arranged between adjacent grooves. Each of the small holes 59 has a diameter of about 2.8 mm. 49 holes are formed on each side of the rectifying plate 52.

The sizes of the slits 55, 56, 57 and 58, the small holes 59, the gaps between the inner wall of the vessel 31 and both side edges of the rectifying plate 52 and the positional relationship among them are determined so that the cleaning liquid flows in parallel from the rectifying plate 52 toward an opening on top of the vessel 31. In this embodiment, the slits are set at such positions that the slits 55 and 56 are located between the rods 42 and 43 of the holder 41 and the slits 57 and 58 are located between the rods 43 and 44 of the holder 41. If a flow of the cleaning liquid passed through the slits 55, 56, 57 and 58 is balanced with only a flow of the cleaning liquid passed through the gaps between the inner wall of the vessel 31 and both side ends of the rectifying plate 52 to form parallel flows, the small holes 59 can be omitted.

Figure 5:
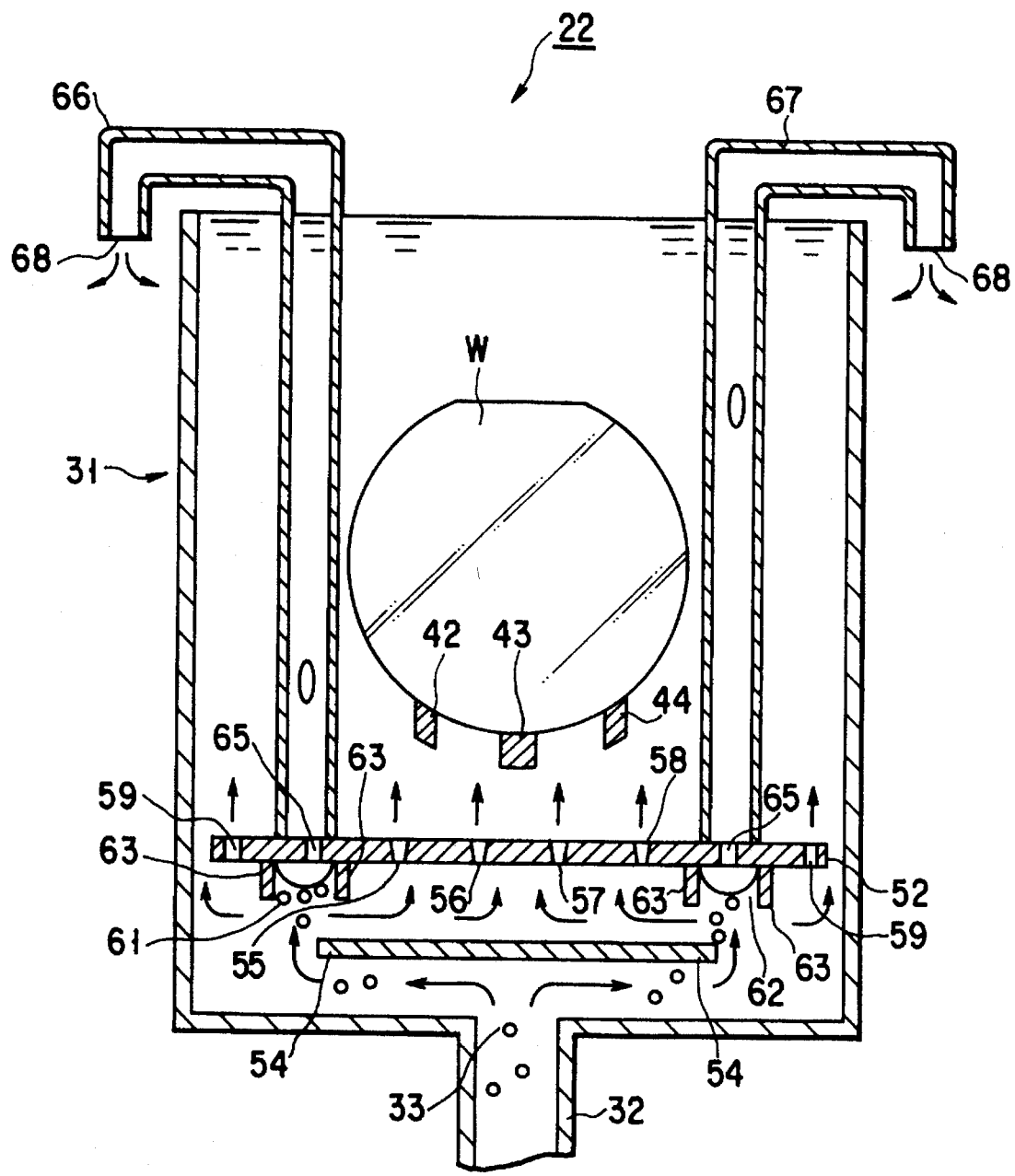
FIG. 5 is a cross-sectional front view showing a modification of the cleaning section.

As shown in FIG. 5, it is possible that the slits 55 and 58 be located outward with respect to the rods 42 and 44 of the holder 41 and that the three rods 42, 43 and 44 be located respectively between the slits 55 and 56, between the slits 56 and 57, and between the slits 57 and 58. Further, as shown in FIG. 5, it is possible that the width of the slits 55, 56, 57 and 58 be increased toward the upper surface of the rectifying plate 52.

Bubble storage members 61 and 62 are formed on the lower surface of the rectifying plate 52, respectively between the slit 55 and a row of the small holes 59 adjacent thereto and between the slit 58 and a row of the small holes 59 adjacent thereto. The bubble storage members 61 and 62 extend in the longitudinal direction of the rectifying plate 52. The bubble storage members 61 and 62 have the same structure: constituted on the four sides thereof by long plates 63 and short plates 64, which project about 5 mm from the lower surface of the rectifying plate 52, and an opened bottom.

End portions of the rectifying plate 52, which form upper surfaces of the bubble storage members 61 and 62, have exhaust holes 65. Exhaust pipes 66 and 67 corresponding to the exhaust holes 65, extending vertically upward, are connected to the rectifying plate 52. The pipes 66 and 67 are arranged symmetrically. Distal end openings 68 of the pipes are directed downward out of both sides of the process vessel 31. The openings 68 of the pipes 66 and 67 can be connected directly with an exhaust of the cleaning system 1. Alternatively, the openings can be received by a receiver formed outside the process vessel, as shown in FIG. 19.

Figure 3:
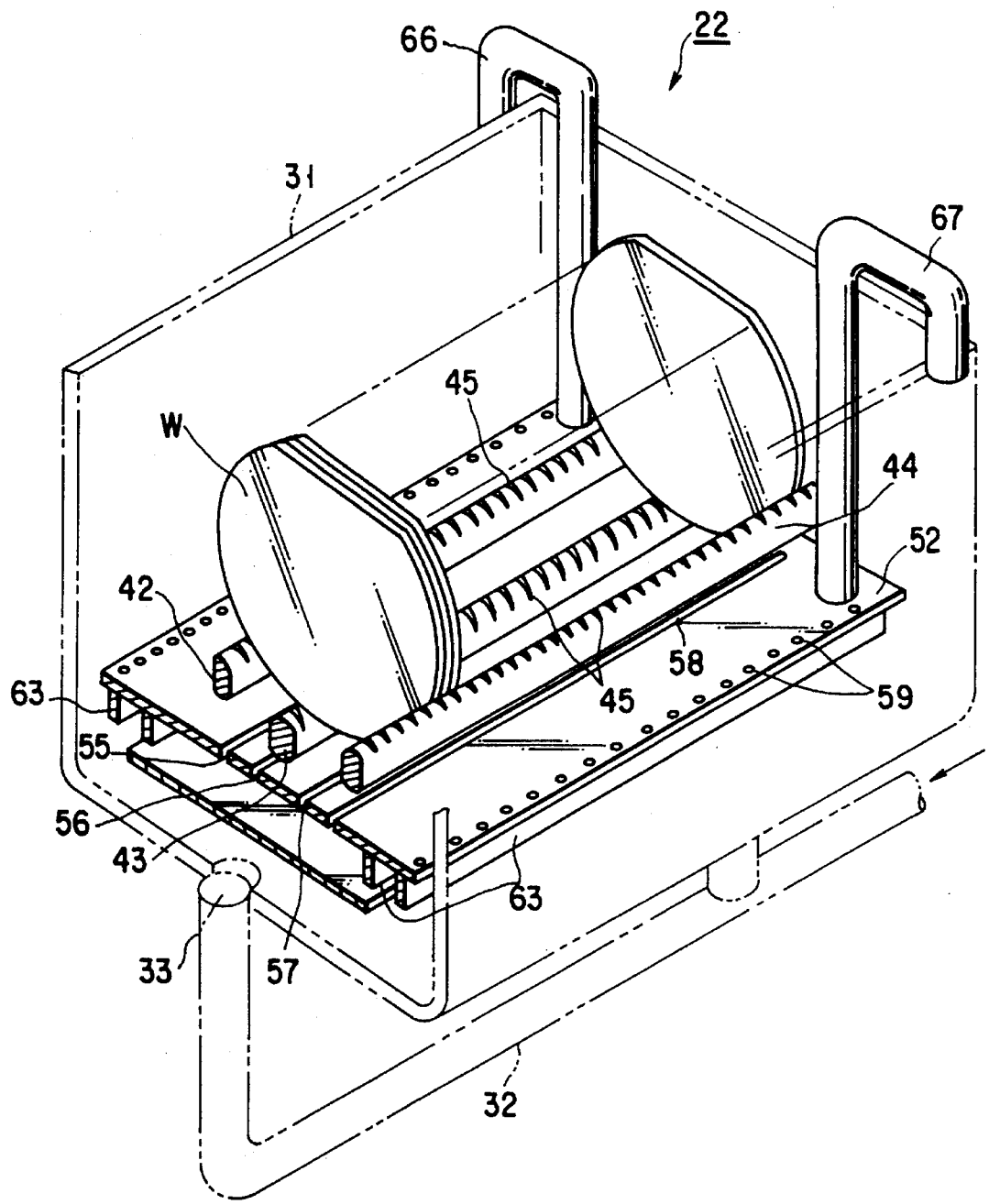
FIG. 3 is a partially sectioned perspective view showing the interior of the process vessel shown in FIG. 2.
Figure 4:
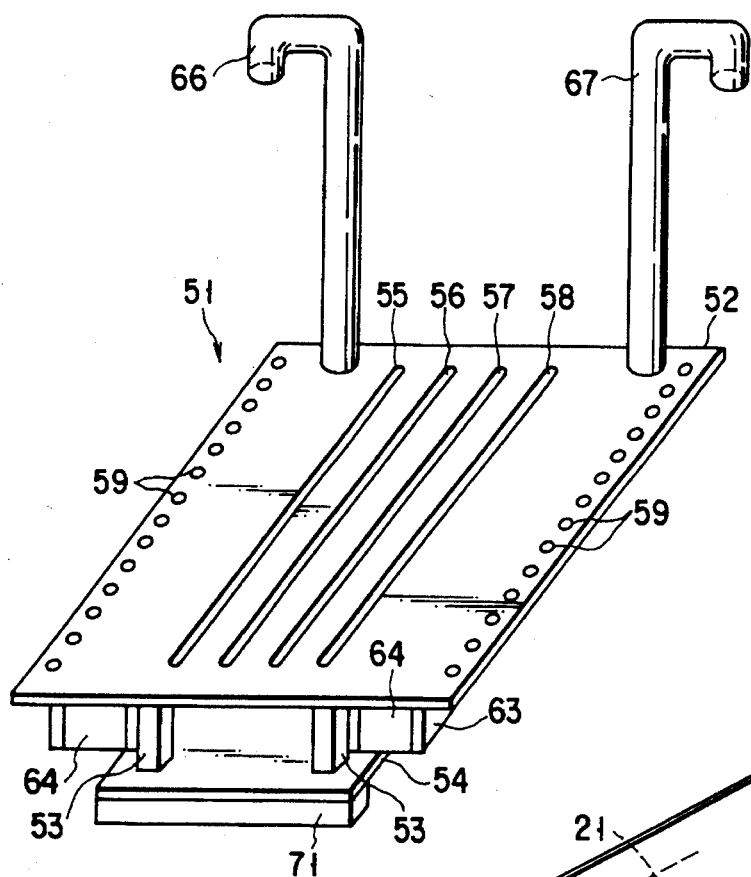
FIG. 4 is a perspective view showing a rectifying plate and the like arranged in the process vessel shown in FIG. 2.

Return plates 71 extend downward at the front and rear ends of the diffusion plate 54, in order to prevent the cleaning liquid from flowing forward and backward. The left and right side ends of the diffusion plate 54 are located just under the bubble storage members 61 and 62, as shown in FIGS. 2 and 3.

Figure 6:
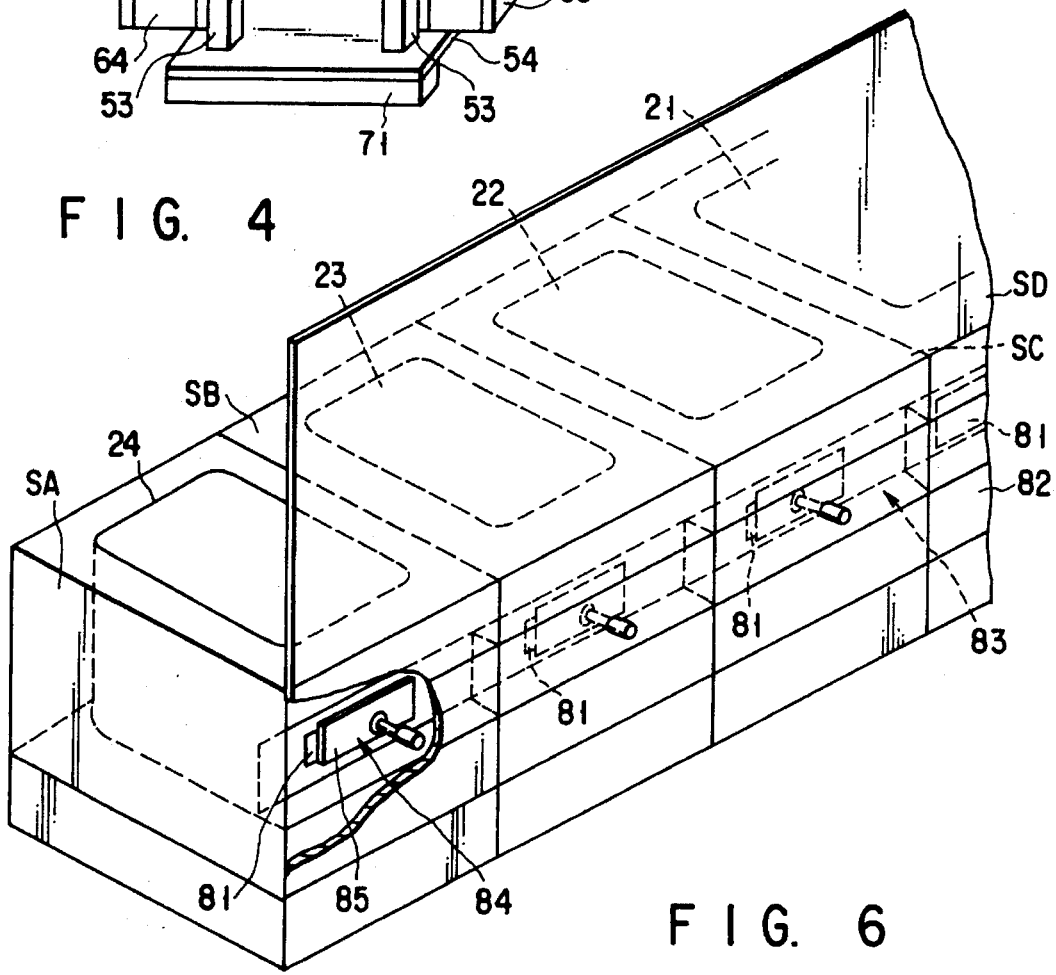
FIG. 6 is an explanatory view showing an exhaust of the cleaning system shown in FIG. 1.

FIG. 6 shows the exhaust of the cleaning system 1.

A lower portion inside the cleaning system 1 is divided into spaces SA, SB, SC, SD . . . corresponding to the chuck cleaning section 21, the chemical cleaning section 22 and the water cleaning sections 23 and 24, and so on. A rectangular exhaust port 81 is formed on the rear side of each of the spaces SA, SB, SC, SD. A collecting duct 83 is formed between a rear plate 82 of the cleaning system 1 and the exhaust port 81, which communicates with the duct 83. The duct 83 communicates with a centralized exhaust system (not shown) of the cleaning system 1. With the structure as described above, since air in each cleaning section of the cleaning system is exhausted via the collecting duct 83, space can be used effectively.

Figure 7A:
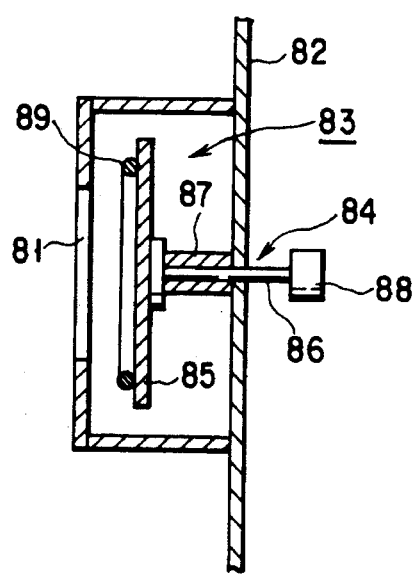
FIGS. 7A and 7B are cross-sectional views respectively showing an opened state and a closed state of a push-type damper of the exhaust shown in FIG. 6.
Figure 7B:
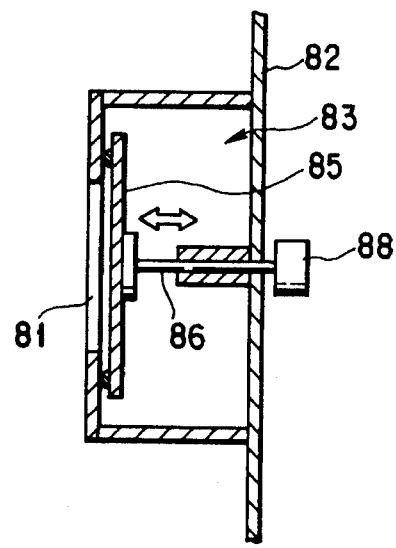

As shown in FIGS. 7A and 7B, a push-type dumper 84 for adjusting the degree of opening is provided for the exhaust port 81. The dumper 84 has a rectangular cover for covering the exhaust port 81. An air-tight sealing material 89 to contact with and be positioned around the exhaust port 81 is formed on the exhaust port 81 side surface of the cover 85. An end of a shaft 86 is fixed to the other surface of the cover 8. The other end of the shaft 86 projects air-tightly through the rear plate 82. The shaft 86 is slidably inserted through a sleeve 87 fixed to the rear plate 82 inside the duct 83. An operating knob 88 is provided on the projecting end of the shaft 86. The shaft 86 can be fixed at a desired position by operating the knob 88.

To close the exhaust port 81, the cover 85 is pressed against the exhaust port 81 by operating the knob 88, as shown in FIG. 7A. On the other hand, to open the exhaust port 81, the cover 85 is drawn by operating the knob 88. In this manner, the degree of opening of the exhaust port can be set to a desired value in a range between 0% and 100%.

According to the conventional exhausting system, air in each cleaning section is exhausted by a butterfly dumper. For this reason, a collection exhaust section, in addition to the operation space for a butterfly valve, must be provided under the cleaning section. As a result, very little maintenance space for each cleaning process vessel need be maintained.

In contrast, since the push-type damper 84 can be arranged in the duct 83, the above-noted problem of space is eliminated. As a result, a necessary maintenance space can be maintained under each cleaning section. The cover 85 can be of any shape, e.g., a circle or a square, in accordance with the shape of the exhaust port 81.

Operation of the cleaning section 22 will now be described with reference to FIGS. 2 and 3.

A cleaning chemical (cleaning liquid) supplied from the supplying port 33 with a suitable pressure is diffused by the diffusion plate 54 toward the peripheral portion thereof. Since the return plates 71 project downward at the front and rear ends of the diffusion plate 54, the cleaning liquid is prevented from diffusing toward the front and rear side of the diffusion plate 54. Therefore, the cleaning liquid is directed toward the left and right sides of the diffusion plate 54 and rises upward through the left and right sides of the diffusion plate 54.

The bubble storage members 61 and 62 are formed above the left and right sides of the diffusion plate 54. If bubbles are contained in the cleaning liquid, they are collected in the bubble storage members 61 and 62. The exhaust holes 65, formed in end portions of the bubble storage members 61 and 62, communicate with the pipes 66 and 67. Therefore, bubbles, collected in the bubble storage members 61 and 62 and grown to a certain degree, are discharged outside the processing vessel 31 through the exhaust holes 65 and the pipes 66 and 67. Thus, even if the bubbles are contained in the cleaning liquid used for cleaning the wafers W, they will not enter a cleaning area above the rectifying plate 52. Accordingly, non-uniformity in cleaning wafers, contamination and vibration of the wafers, due to bubbles, will not occur.

The cleaning liquid, flowing inward under the inner long plates 63 of the bubble storage members 61 and 63, is rectified while passing through the slits 55, 56, 57 and 58. The cleaning liquid, flowing outward under the outer long plates 63 of the bubble storage members 61 and 62, is also rectified while passing through the small holes 59 or the gaps between the inner wall of the vessel 31 and both side edges of the rectifying plate 52. In the cleaning area above the rectifying plate 52, the cleaning liquid passed through the aforementioned portions does not circulate but flows substantially vertically upward parallel to the opening on top of the vessel 31. The wafers W held by the holder 41 are thus cleaned uniformly under substantially the same conditions.

Figure 12:
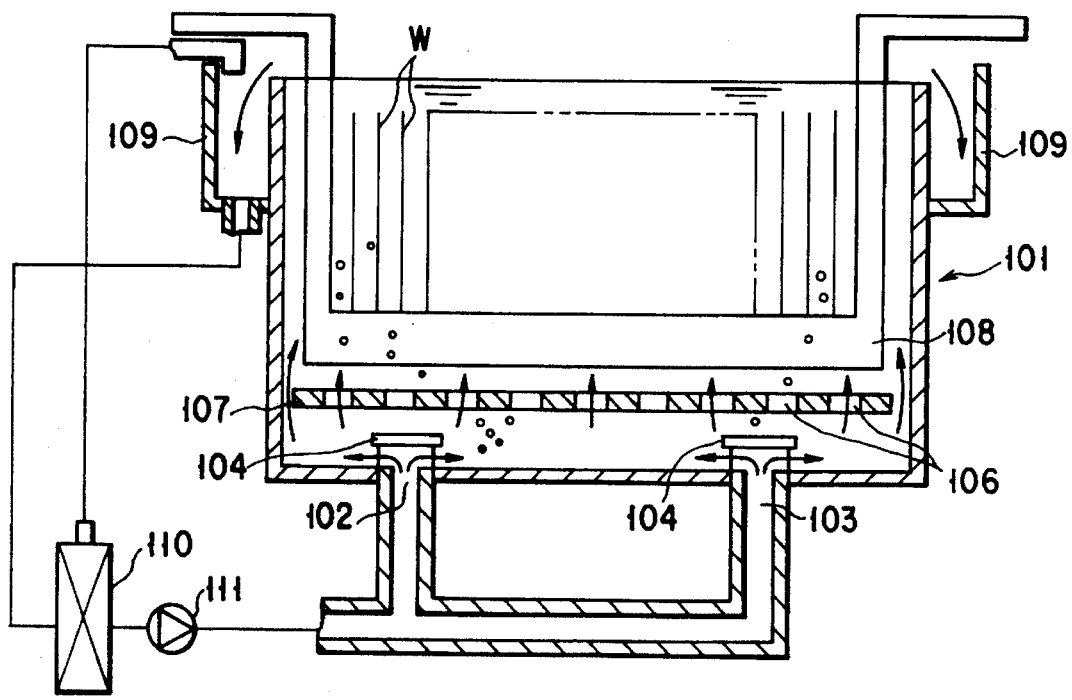
FIG. 12 is a cross-sectional side view showing the interior of a process vessel of a conventional cleaning apparatus.

The conventional diffusion plates 104, as shown in FIG. 12, are small and circular. Moreover, they are individually provided above the supplying ports 102 and 103. With this structure, the flow rate of the cleaning liquid is different in portions near and apart from the supplying ports 102 and 103. As a result, it is difficult to form a uniform flow of the cleaning liquid flowing among the wafers and to improve the circulation efficiency (specific resistivity recovery characteristic).

In contrast, the diffusion plate 54 of the present invention is formed of one plate and the cleaning liquid is diffused from the left and right side edges of the diffusion plate 54. For this reason, the flow rate of the cleaning liquid is not influenced by the distance from the supplying port 33.

As shown in FIG. 2, the cleaning liquid flowing upward through each of the left and right side edges of the diffusion plate 54 is branched leftward and rightward by the bubble storage members 61 or 62. Therefore, it is possible to adjust the amount of the cleaning liquid flowing through the slits 55, 56, 57 and 58 by changing the height of the long plates 63, the number and size of small holes 59 and the size of the gaps between the inner wall of the vessel 31 and both side edges of the rectifying plate 52.

Figure 8:
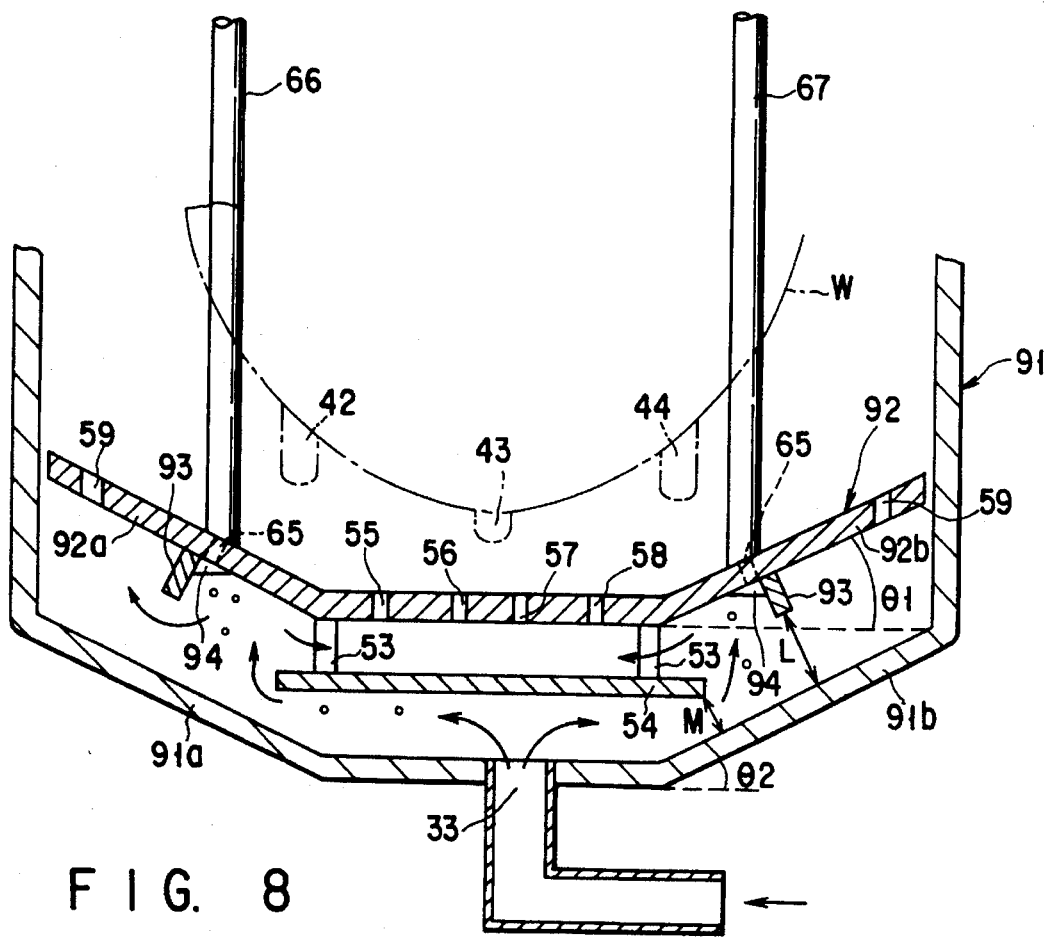
FIG. 8 is a cross-sectional front view showing the interior of a process vessel of a cleaning section according to another embodiment of the present invention.

FIG. 8 is a cross-sectional front view showing the interior of a processing vessel of a cleaning section according to another embodiment of the present invention. In FIG. 8, the members corresponding to those of the above embodiment are identified with the same reference numerals as used above.

In this embodiment also, a rectifying plate 92 and a diffusion plate 54 are integrally connected with each other via a support column 53, and these plates and the column are formed of an anticorrosive material, such as quartz. The rectifying plate 92 has on both sides thereof inclined portions 92a and 92b, which are inclined upward at a predetermined elevation angle of $\theta_1$. The elevation angle $\theta_1$ of the inclined portions 92a and 92b is set to 5° to 50°, preferably 15° to 30°. The bottom of a process vessel 91 also has, on both sides thereof, inclined portions 91a and 91b which are inclined at an elevation angle of $\theta_2$. The elevation angle $\theta_2$ can be the same as the elevation angle $\theta_1$ of the rectifying plate 92. However, it is preferable that $\theta_2$ be greater than $\theta_1$.

Plates 93 are fixed to the lower surfaces of the inclined portions 92a and 92b. Portions, each having a substantially triangular cross-section, are defined by the inner surfaces of the plates 93 and the inclined portions 92a and 92b. These triangular portions function as bubble storage members 94. In end portions of the bubble storages 94, exhaust holes 65 are formed in the rectifying plate 92, as in the above embodiment. Exhaust pipes 66, 67 are connected to the holes 65. The distance L between the lower end of each plate 93 formed on the inclined portion 92a or 92b and the inclined portion 91a or 91b of the process vessel 91 is longer than the distance M between each side end of the diffusion plate 54 and the inclined portion 91a or 91b of the process vessel 91.

If bubbles are contained in the cleaning liquid supplied through the supplying port 33, they are branched toward the eft and right by the diffusion plate 54 and collected in the bubble storage members 94. The bubbles, grown to a certain degree in the bubble storage members 94, are discharged outside the process vessel 91 through the exhaust holes 65 and the pipes 66, 67.

Since the bubble storage members 94 are formed only by fixing the plates 93 to the inclined portions 92a and 92b of the rectifying plate 92, the structure of the storage members is further simplified as compared to that of the processing vessel 31 of the above embodiment. In addition, since the inclined portions 92a and 92b are formed on both sides of the rectifying plate 92, turbulence of the cleaning liquid is not easily generated. Hence, the cleaning liquid is efficiently rectified and allowed to flow uniformly toward the wafers W, resulting in the wafers being cleaned further uniformly.

Moreover, the distance L between the lower end of each plate 93 formed on the inclined portion 92a or 92b and the inclined portion 91a or 91b of the processing vessel 91 is longer than the distance M between each side end of the diffusion plate 54 and the inclined portions 91a or 91b of the processing vessel 91. Therefore, the flow of the cleaning liquid toward the wafers W due to the diffusion by means of the diffusion plate 54 (branching into both sides) can be controlled uniformly, owing to the conductance of fluid. Thus, the cleaning can be uniformly performed in this respect also.

Since the inclined portions 91a and 91b are formed on both sides of the bottom of the processing vessel 91 itself, the dead space or the area wherein the liquid is stagnant is reduced. Accordingly, the absolutely required capacity of the processing vessel 91 is also reduced. Therefore, the required amount of cleaning liquid can be saved and the running cost can be lowered.

Figure 9:
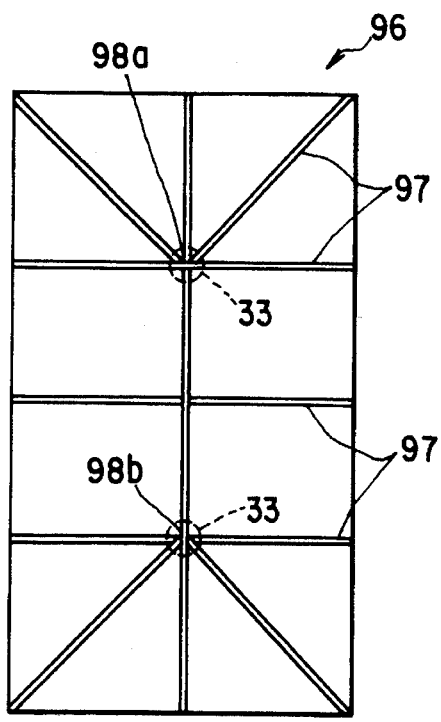
FIG. 9 is a bottom view showing a modification of a diffusion plate.
Figure 10:
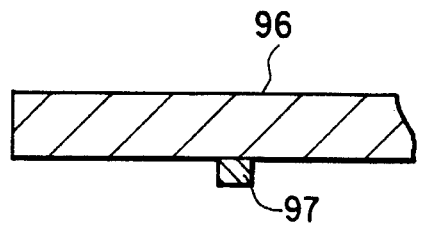
FIG. 10 is an enlarged cross-sectional view showing part of the diffusion plate shown in FIG. 9 and a guide projection line formed thereon.

The rear surface of the diffusion plate 54 is flat. Instead, a diffusion plate 96 as shown in FIG. 9 can be used. The diffusion plate 96 is the same as the diffusion plate 54 in size but different therefrom in terms of the existence of a plurality of guide projection lines 97 on its rear surface. The projection lines 97 extend substantially radially from portions 98a and 98b positioned just above the two supplying ports 33. The projection lines 97 can be formed by laying rectangular quartz materials having a square cross section (one side is about 3 mm) on the rear surface of the diffusion plate 96, as shown in FIG. 10.

With this diffusion plate 96, since the cleaning liquid supplied from the supplying port 33 is guided by the guide projection lines 97 upon striking against the diffusion plate, the flow of the cleaning liquid can be rectified efficiently. Furthermore, if bubbles are contained in the cleaning liquid, they can be dispersed uniformly along the projection lines 97, i.e., substantially radially. Therefore, the cleaning liquid is prevented from flowing at various flow rates due to bubbles contained therein and is allowed to uniformly flow along the wafers W.

Figure 11:
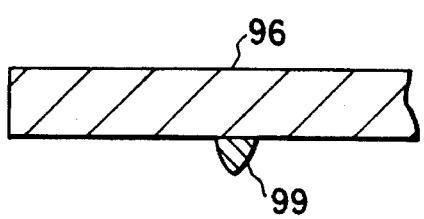
FIG. 11 is an enlarged cross-sectional view showing part of a modification of the guide projection line formed on the diffusion plate.

A guide projection line 99 formed of a substantially triangular material, as shown in FIG. 11, can also be used. The guide projection line can be of any shape, so long as it can guide and uniformly disperse the cleaning liquid supplied through the supplying port.

In the above embodiments, the present invention is applied to a cleaning section of a semiconductor wafer cleaning system. However, the present invention is applicable to an LCD substrate cleaning system in the same manner.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A cleaning apparatus in a semiconductor processing system, comprising:

a processing vessel storing a cleaning liquid;

a supplying system supplying the cleaning liquid, said supplying system having a supplying port arranged in a lower portion of the processing vessel;

a holder holding a plurality of substrates to be processed in the processing vessel, such that the substrates are arranged in a first direction at intervals, the holder being provided above the supplying port in the vessel;

a rectifying plate, interposed between the supplying port and the holder, partitioning the processing vessel into a cleaning area in which the holder is provided and a bottom area in which the supplying port is arranged, the rectifying plate having a slit which connects the bottom area and the cleaning area, the slit extending in the first direction and being located under the substrates to be processed, which are arranged on the holder; and a diffusion plate interposed between the supplying port and the rectifying plate, said diffusion plate crossing a vertical line connecting the supplying port and the slit wherein the rectifying plate has a central portion and a pair of inclined portions inclined upwards from both sides of the central portion along bend lines extending in the first direction.

2. The apparatus according to claim 1, further comprising a pair of side passages of the cleaning liquid, extending in the first direction near an inner surface of the vessel, wherein the slit is located between the side passages.

3. The apparatus according to claim 2, wherein the diffusion plate has a pair of side edges extending in the first direction, each of the side edges being located between the slit and each of the side passages.

4. The apparatus according to claim 3, wherein the slit has a plurality of parallel slit portions, arranged symmetrically with respect to a center of the substrates to be processed.

5. The apparatus according to claim 4, wherein the holder has a pair of holding rods extending in the first direction, the slit portions are arranged between the holding rods, and the side passages are arranged outward in respect of the holding rods.

6. The apparatus according to claim 1, wherein the diffusion plate comprises guide projection lines extending substantially radially from a portion just above the supplying port.

7. The apparatus according to claim 1, wherein the vessel comprises a bottom having a central portion and a pair of inclined portion inclined upward from both sides of the central portion along bend lines extending in the first direction.

8. The apparatus according to claim 1, further comprising:

a bubble storage member, arranged between the diffusion plate and the rectifying plate, collecting bubbles contained in the cleaning liquid; and an exhaust passage connecting the bubble storage member and an outside of the vessel.

9. The apparatus according to claim 8, wherein the diffusion plate has a pair of side edges extending in the first direction, the bubble storage member has a pair of bubble storage portions located just above the side edges of the diffusion plate, and the exhaust passage has a pair of exhaust passage portions corresponding to the pair of bubble storage portions.

10. The apparatus according to claim 9, wherein each of the bubble storage portions is defined by an enclosure member formed on a lower surface of the rectifying plate, and each of the exhaust passage portions has an exhaust hole formed in the rectifying plate and an exhaust pipe connected to the rectifying plate so as to communicate with the exhaust hole.

11. A cleaning apparatus in a semiconductor processing system, comprising:

a processing vessel storing a cleaning liquid;

a supplying system supplying the cleaning liquid, said supplying system having a supplying port arranged in a lower portion of the process vessel;

a holder holding a plurality of substrates to be processed in the processing vessel, such that the substrates are arranged in a first direction at intervals, the holder being provided above the supplying port in the vessel;

a rectifying plate, interposed between the supplying port and the holder, partitioning the processing vessel into a cleaning area in which the holder is provided and a bottom area in which the supplying port is arranged, the rectifying plate having an opening which connects the bottom area and the cleaning area;

a diffusion plate interposed between the supplying port and the rectifying plate so as to cross a vertical line connecting the supplying port and the opening;

a bubble storage member, arranged between the diffusion plate and the rectifying plate and collecting bubbles contained in the cleaning liquid; and an exhaust passage connecting the bubble storage and an outside of the vessel.

12. The apparatus according to claim 11, wherein the diffusion plate has a pair of side edges extending in the first direction, the bubble storage member has a pair of bubble storage portions located just above the side edges of the diffusion plate, and the exhaust passage has a pair of exhaust passage portions corresponding to the pair of bubble storage portions.

13. The apparatus according to claim 12, wherein each of the bubble storage members is defined by an enclosure member formed on a lower surface of the rectifying plate, and each of the exhaust passage portions has an exhaust hole formed in the rectifying plate and an exhaust pipe connected to the rectifying plate so as to communicate with the exhaust hole.

14. The apparatus according to claim 11, wherein the diffusion plate comprises guide projection lines extending substantially radially from a portion just above the supplying port.

15. The apparatus according to claim 11, further comprising a pair of side passages of the cleaning liquid, extending in the first direction near an inner surface of the vessel, wherein the opening is located between the side passages.

16. The apparatus according to claim 15, wherein the opening comprises a slit extending in the first direction and located under the substrates to be processed, which are arranged on the holder.

17. The apparatus according to claim 16, wherein the diffusion plate has a pair of side edges extending in the first direction, each of the side edges being located between the slit and each of the side passages.

18. The apparatus according to claim 17, wherein the slit has a plurality of parallel slit portions, arranged symmetrically with respect to a center of the substrates to be processed.

19. The apparatus according to claim 18, wherein the holder has a pair of holding rods extending in the first direction, the slit portions are arranged between the holding rods, and the side passages are arranged outward in respect of the holding rods.

* * * * *